United States Patent [19]

Bose et al.

[11] 4,455,675

[45] Jun. 19, 1984

[54] HEADPHONING

[75] Inventors: Amar G. Bose, Wayland; John Carter, Cambridge, both of Mass.

[73] Assignee: Bose Corporation, Framingham, Mass.

[21] Appl. No.: 372,471

[22] Filed: Apr. 28, 1982

[51] Int. Cl.³ ............................................... H04R 1/10
[52] U.S. Cl. ........................................ 381/74; 381/71; 381/96; 179/156 R
[58] Field of Search ................... 179/156 R, 180, 184, 179/107 R, 107 FD; 381/96, 74, 71

[56] References Cited

U.S. PATENT DOCUMENTS

| | | | |
|---|---|---|---|
| 4,017,797 | 4/1977 | Laessig | 179/156 R X |
| 4,025,734 | 5/1977 | Aloupis | 179/156 R |
| 4,087,653 | 5/1978 | Frieder, Jr. et al. | 179/156 R |

Primary Examiner—A. D. Pellinen
Assistant Examiner—James L. Dwyer
Attorney, Agent, or Firm—Charles Hieken

[57] ABSTRACT

Headphones have a small cavity between the diaphragm and the ear canal with a microphone in the cavity closely adjacent to the diaphragm providing a feedback signal that is combined with the input electrical signal to be reproduced by the headphones to provide a combined signal that is power amplified for driving the diaphragm.

9 Claims, 14 Drawing Figures

23-MEASURED NOISE REDUCTION
24-THEORETICAL NOISE REDUCTION

20-OPEN LOOP GAIN
21-CLOSED LOOP GAIN

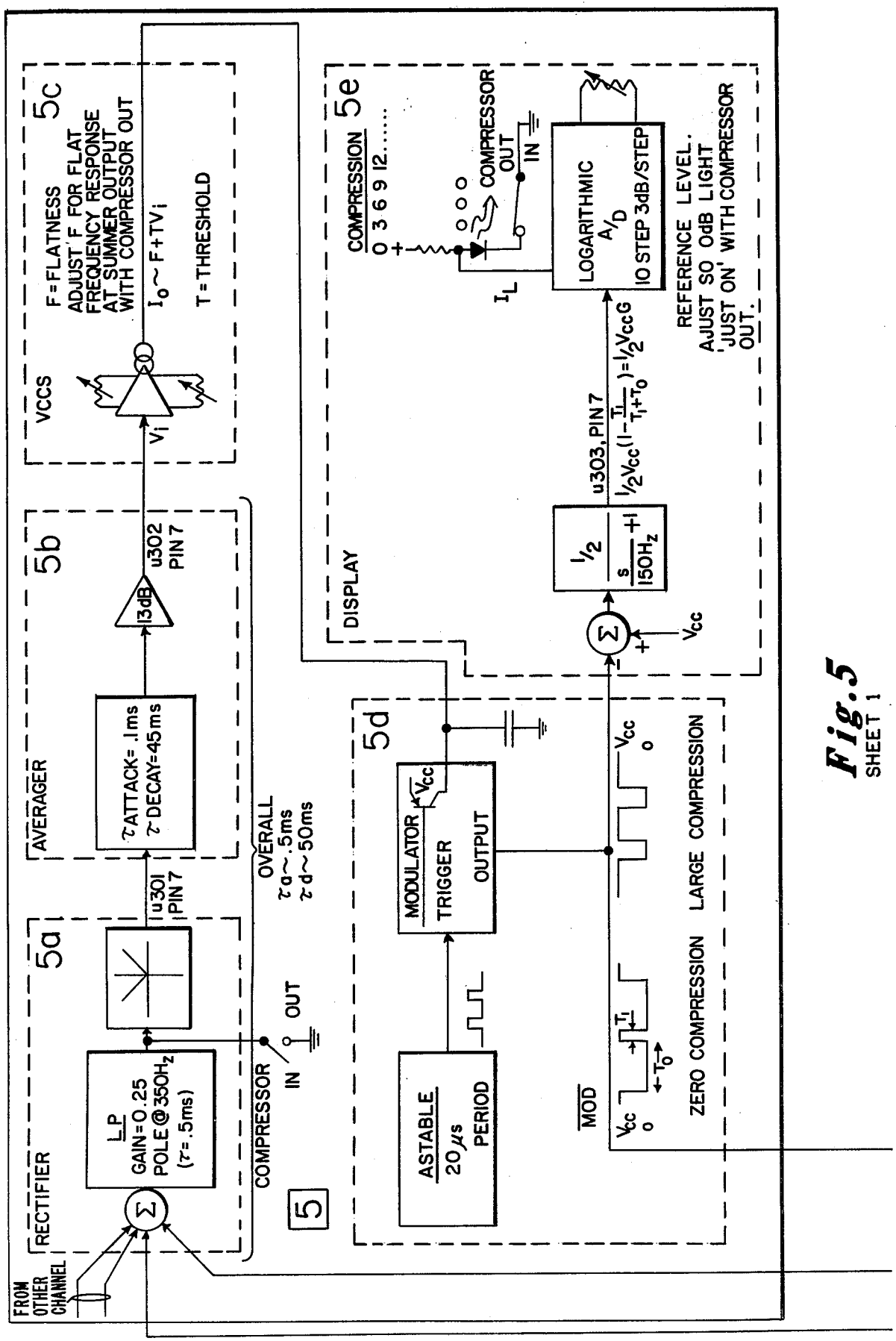
*Fig. 5* SHEET 1

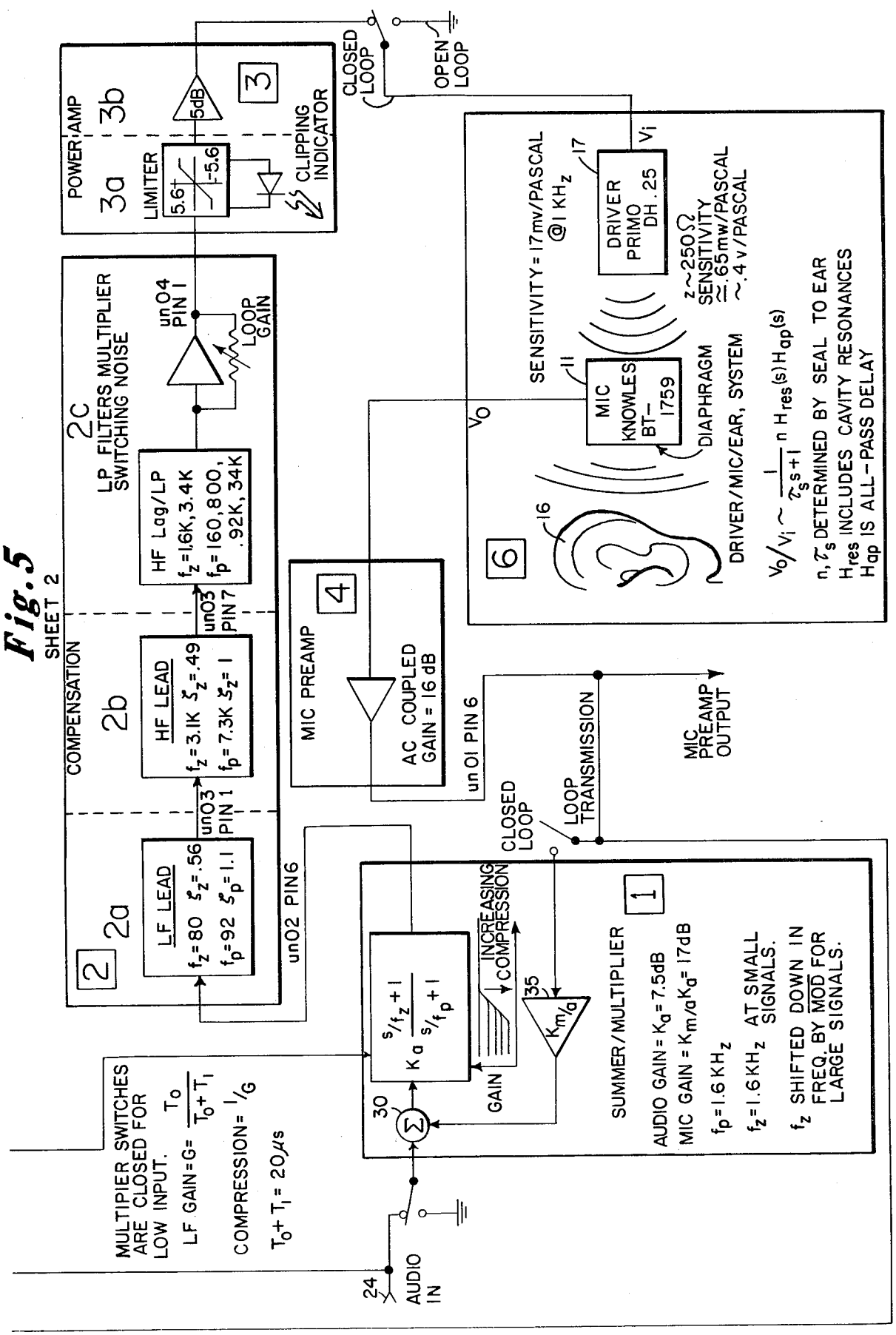
Fig. 5 Sheet 2

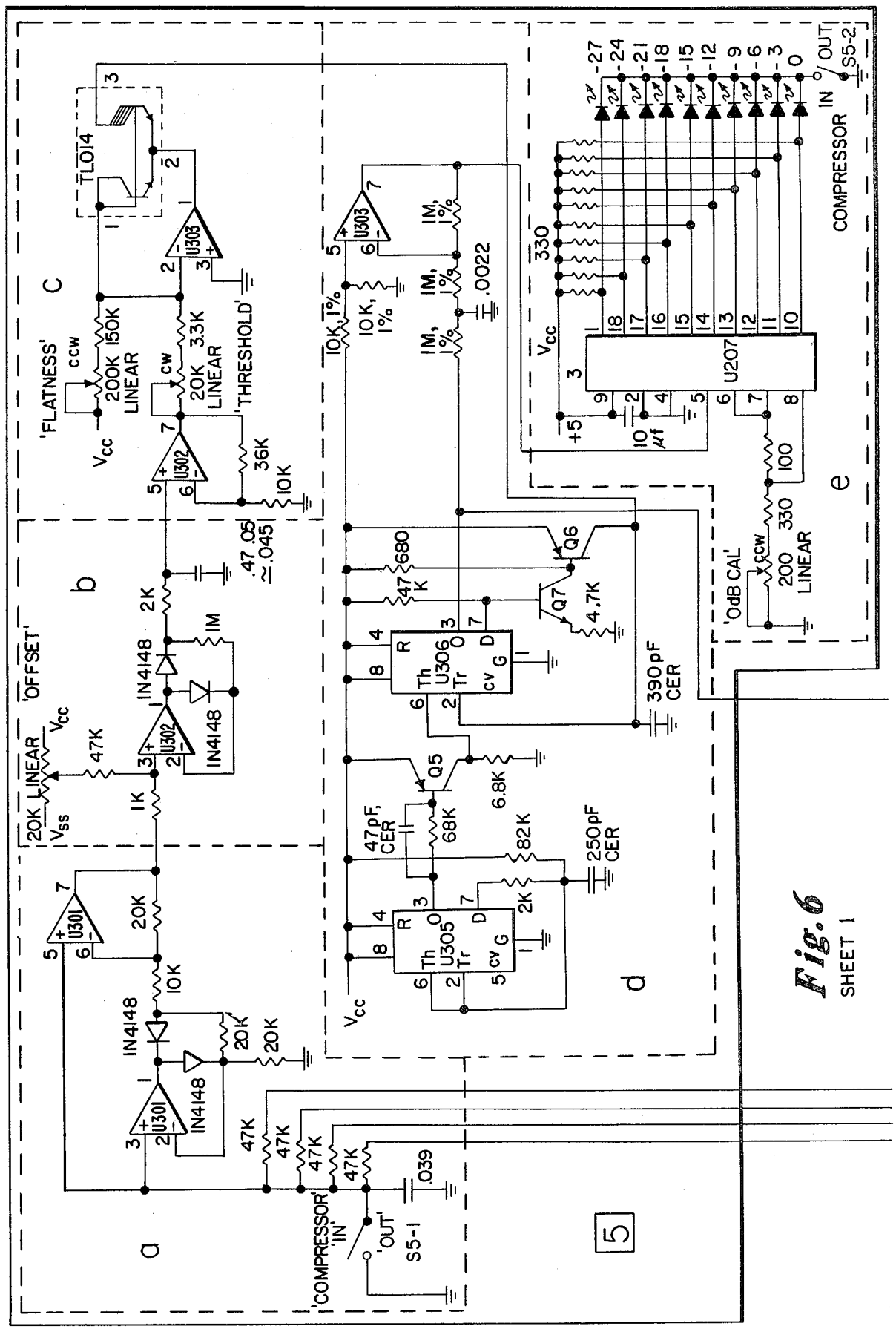
Fig. 6 SHEET 1

SHEET 2

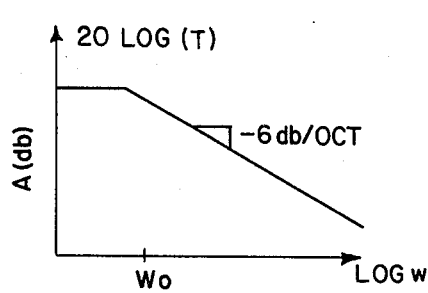
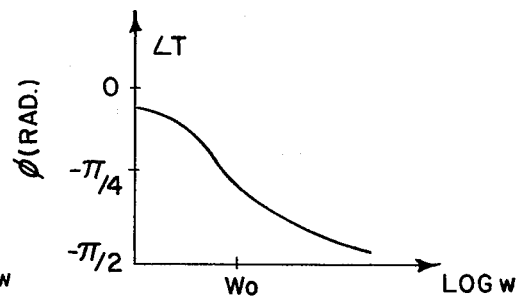
Fig. 9A  Fig. 9B
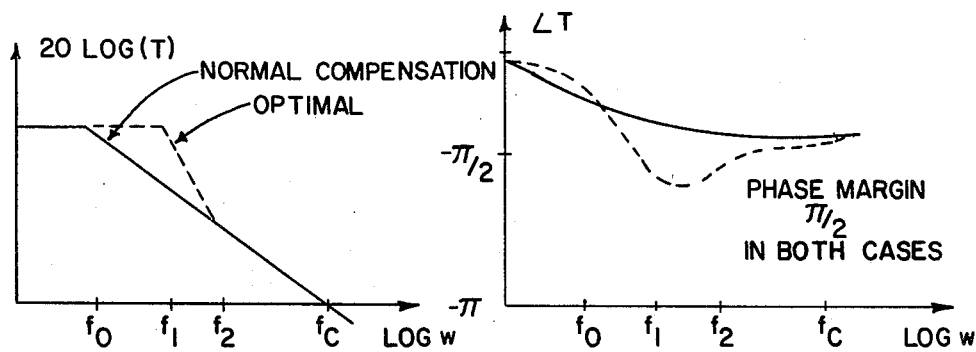
Fig. 10A  Fig. 10B
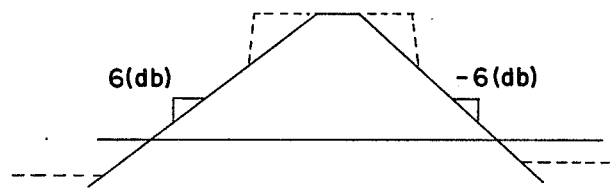
Fig. 11

HEADPHONING

The present invention relates in general to headphoning and more particularly concerns novel apparatus and techniques for reducing noise, and producing a relatively uniform frequency response that does not vary appreciably among users while reducing distortion. The invention achieves these results with relatively compact headphones that may be worn comfortably without excessive pressure on the head from forces urging the cups against the head. The invention achieves noise reduction while faithfully reproducing a music or speech signal.

A typical prior art approach for providing noise attenuation is to use a headset having high mass, large internal volume and a spring support that exerts heavy pressure upon the head. The high mass increases inertia which resists acceleration and also contributes to the structural rigidity of the headset walls. The heavy pressure effects a seal without air leaks to increase low-frequency attenuation. The compliant air cavity of the internal volume provides high-frequency rolloff. However, most of these techniques increase the discomfort the user experiences.

Prior art active noise cancellation techniques include an approach utilizing a microphone external to the headset for transducing external noise. An electrical system then processes the transduced noise signal in a manner similar to the attenuation produced by the headset upon the noise sound signal to provide an oppositely phased signal to the headphone driver for canceling the external noise. This approach is an open-loop system that does not adapt to different users and may actually increase the noise level inside the headset. Another approach uses a closed loop or servomechanism system, such as described in report AB-A009 274 distributed by the National Technical Information Service entitled A STUDY OF PROPOSED EAR PROTECTION DEVICES FOR LOW FREQUENCY NOISE ATTENUATION by Patrick Michael Dallosta dated April 1975. U.S. Pat. No. 3,009,991 discloses a velocity-sensitive microphone closely adjacent to a loudspeaker diaphragm in a feedback loop. U.S. Pat. No. 3,562,429 discloses motional feedback, remote acoustical feedback and feedback around a headphone.

Accordingly, it is an important object of this invention to provide an improved headphone system.

According to the invention, there is means defining a headphone cavity and electroacoustical transducing means, such as a pressure sensitive microphone, within the cavity for providing a signal corresponding to the sum of external noise and the sound produced by the headphone driver in the same cavity. There is means for combining this transduced signal with the input signal desired to be reproduced to produce an error signal representative of the noise and other differences between the input sound signal to be reproduced and the output of the headphone driver in that cavity. Servo means comprising the means for combining comprises means for compensating for these error signals to produce an output acoustical signal at the ear with external noise and distortion significantly reduced and with substantially uniform frequency response between the input to which the signal desired to be reproduced is applied and the ear.

Cushion means are located between the ear and headphone for preventing significant leaks and preventing appreciable divergence in the pressure field. The cushion means is sufficiently compliant to conform to the irregular shape of the ear and effect the desired seal and is of sufficiently high density and flow resistance so that the cavity portion defined thereby functions substantially as an ideal cavity with rigid walls to establish a boundary condition of zero velocity in pressure waves at the cavity wall to insure that the pressure amplitude is substantially constant for wavelengths much larger than the maximum distance across the cavity. The electroacoustical transducing means is positioned so that it is close to the headphone driving means and responsive to the pressure in the cavity near the ear. Preferably, the headphone driver means comprises a diaphragm operating as a piston over the audio frequency range of interest. The span across the diaphragm, such as the diameter of a circular diaphragm, is preferably relatively small, such as less than $\frac{1}{8}$ wavelength at the highest audio frequency of interest.

Numerous other features, objects and advantages of the invention will become apparent from the following specification when read in connection with the accompanying drawing in which:

FIG. 5 is a block diagram illustrating the logical arrangement of a preferred embodiment of the invention;

FIGS. 9A and 9B show gain and phase characteristics for a normal operational amplifier having a first order characteristic;

FIGS. 10A and 10B show modifications to the characteristics of FIGS. 9A and 9B, respectively, according to the invention; and FIG. 11 is a modified band pass response according to the invention.

Figure 1:
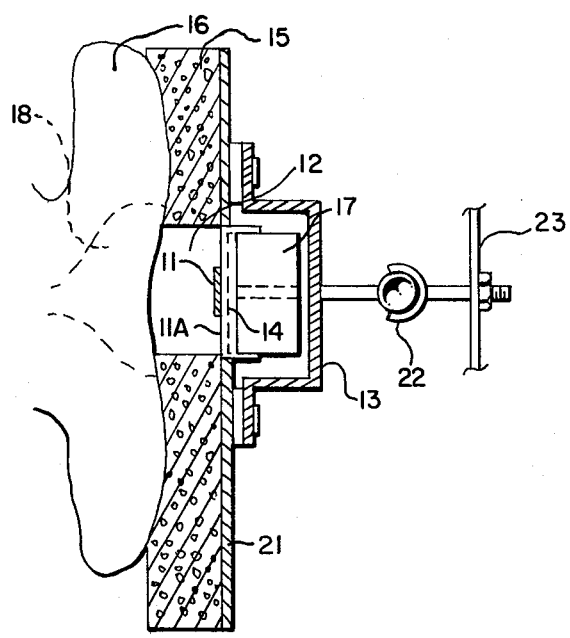
FIG. 1 is a diagrammatical representation partially in section of a headphone on the ear according to the invention through section 1—1 of FIG. 1A showing a plan view seen from the ear.
Figure 1A:
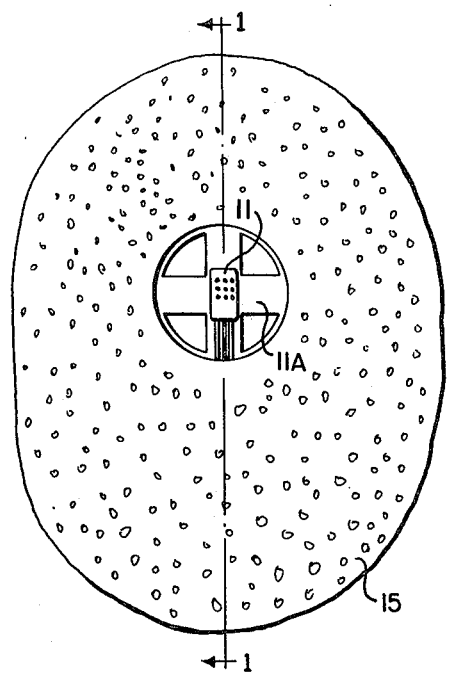

With reference now to the drawing and more particularly FIG. 1 thereof, there is shown a diagrammatic representation of a headphone on an ear according to the invention. A microphone 11 is positioned in cavity 12 essentially coaxial with headphone housing 13, driver 17 and driver diaphragm 14, with cushion 15 sealing the region between outer ear 16 and cushion support 21 of the headphone. Microphone 11 is close to the entrance of ear canal 18 to insure that the amplitude of the pressure wave at microphone 11 is substantially the same as that at the entrance to ear canal 18. Cavity 12 is made as small as practical to help insure that the pressure is essentially constant throughout the cavity. To this end cushion 15 has high mechanical compliance, high flow resistance, high density, and the axial cross sectional area is about the same as that of diaphragm 14 and less than the axial annular cross sectional area of cushion 15 around cavity 12. Headphone housing 13 is connected by friction ball joint 22 to resilient headband 23, shown partially in FIG. 1, in conventional manner.

A typical material for headphone cushion 15 is a slow recovery open cell polyurethane foam. Cushion 15 presses against outer ear 16 over a relatively large area to effect a good seal while distributing the force required to maintain the good seal over a sufficiently large area so that pressure on the ear is sufficiently low to avoid discomfort to the user. Open cell high flow resistance material offers the mechanical advantages of open cell material for conforming to the irregular shape of the ear while providing the acoustical advantages of closed cell material in significantly attenuating spectral components above a predetermined frequency in the middle range of frequencies, such as 2 kHz. It also maintains the pressure inside the cavity essentially uniform through this frequency range. Fluid-filled cushions also have these properties. This structural arrangement according to the invention may be contrasted with typical prior art approaches using a circumaural seal that creates a large cavity with high pressures on the head developed in response to the force required to maintain the circumaural seal or open cell low flow resistance cushions that negligibly attenuate low frequency signals. These prior art cavities are characterized by a large pressure field divergence and require greater diaphragm excursion to produce a given sound pressure level than is required for the small cavity according to the invention. Thus, the invention achieves better acoustical performance with a smaller compact package that is more comfortable for the user.

Figure 2:
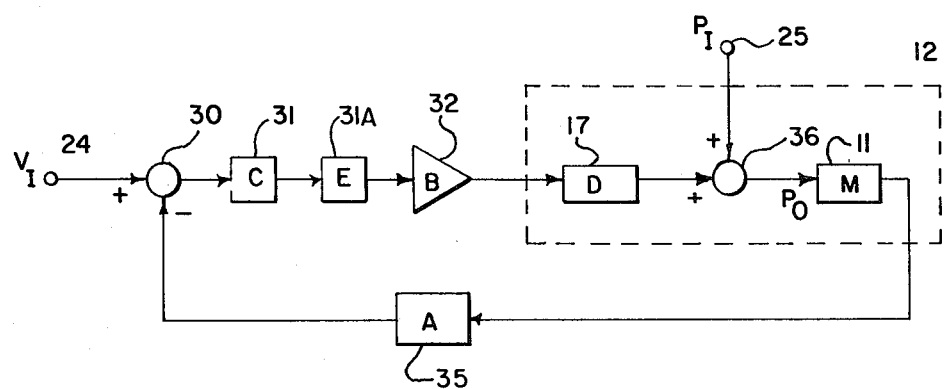
FIG. 2 is a block diagram illustrating the logical arrangement of a servo system according to the invention.

Referring to FIG. 2, there is shown a block diagram illustrating the logical arrangement of a system according to the invention. A signal combiner 30 algebraically combines the signal desired to be reproduced by the headphone on input terminal 24 with a feedback signal provided by microphone preamplifier 35. Signal combiner 30 provides the combined signal to the compressor 31 which limits the level of high level signals. This in turn provides the compressed signal to compensator 31A. The compensation circuits 31A ensure that the open loop gain meets the Nyquist stability criteria, so that the system will not oscillate when the loop is closed. The system shown is duplicated once each for the left and right ears.

Power amplifier 32 energizes headphone driver 17 to produce an acoustic signal in cavity 12 that is combined with an outside noise signal that enters cavity 12 from a region represented as acoustic input terminal 25 to produce a combined acoustic pressure signal in cavity 12 represented as a circle 36 to provide a combined acoustic pressure signal applied to and transduced by microphone 11. Microphone preamplifier 35 amplifies the transduced signal and delivers it to signal combiner 30.

Figure 4:
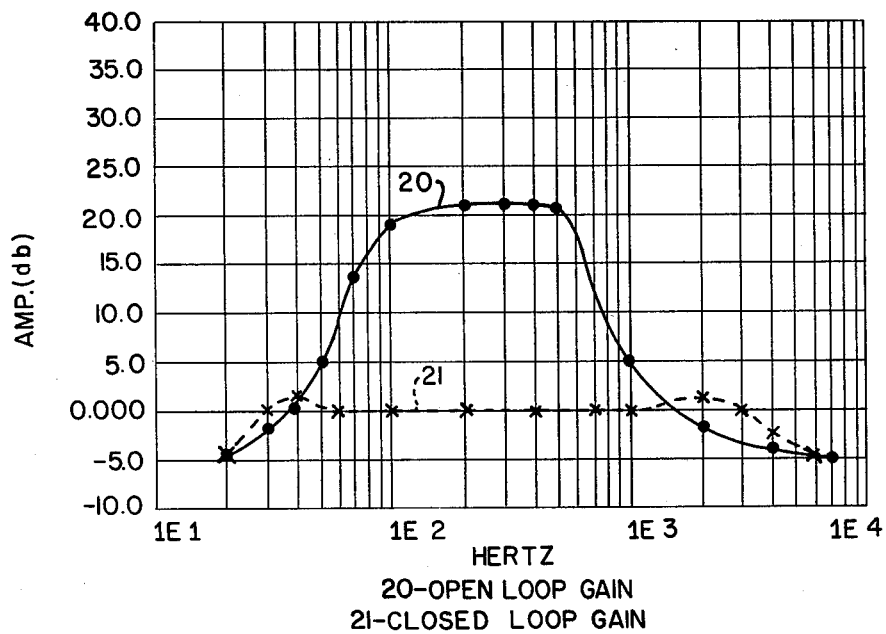
FIG. 4 is a graphical representation showing open loop gain and closed loop gain of the servo system plotted to a common frequency scale.

The compensation circuits 31A are designed so that the loop gain T(s) is maximized over a region of 40–2000 Hz (open loop) as represented by curve 20 in FIG. 4. This loop gain is P(s)=(CBDEMA) where DM is the transfer function of the electrical signal output of the microphone 11 referred to the electrical input to driver 17, A, B, C, E, D and M being the transfer characteristics of microphone preamplifier 35, power amplifier 32, compressor circuits 31, compensation circuits 31A, driver 17 and microphone 11, respectively. This loop gain is maximized subject to the constraints that the phase margin and magnitude margin be high enough to insure stability in differing conditions, including on the head of different individuals and off the head.

The closed loop transfer function from electrical input to pressure output, Po, at the entrance to the ear canal is:

$$P_o/V_I = T_u = CBDE/(1 + CBDEMA).$$

The magnitude of this closed loop transfer function as a function of frequency corresponds to curve 21 shown in FIG. 4. The amount of active noise reduction where $P_I$ corresponds to the acoustical noise input is:

$$(P_o/P_I) = N_R = 1 + CBDEMA = 1 + T(s).$$

Figure 3:
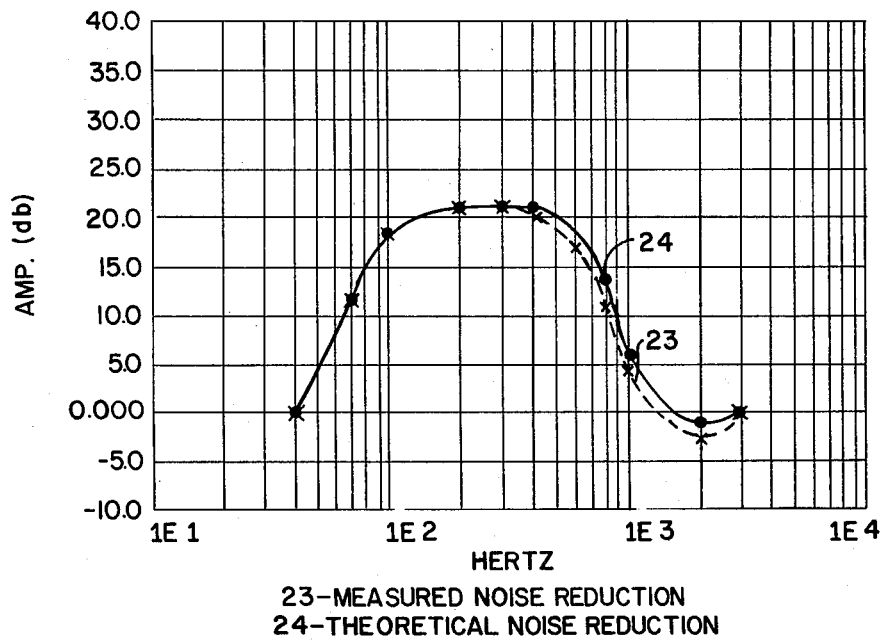
FIG. 3 is a graphical representation of measured noise reduction achieved with the invention in comparison with the theoretical noise reduction available.

Referring to FIG. 3, there is shown a graphical representation of the actual noise reduction measured by a microphone simulating the eardrum by curve 23 in comparison with the theoretical value obtained by measuring the open loop gain plus 1 represented by curve 24.

Referring to FIG. 5, there is shown a block diagram illustrating the logical arrangement of a preferred embodiment of the invention. It is convenient to represent the system by six blocks designated by enclosed numerals 1-6, respectively, and subdividing compensation block 2 into three subblocks 2a, 2b and 2c, respectively, power amplifier block 3 into subblocks 3a and 3b, respectively, and compressor block 5 into five subblocks 5a, 5b, 5c, 5d and 5e, respectively. The portions of the circuitry forming the blocks of FIG. 5 have been indicated by suitable broken-line boundaries in FIG. 6. Since those skilled in the art will be able to practice the invention by building the circuit of FIG. 6, the circuits will not be described in excessive detail. It will be convenient to refer to both FIGS. 5 and 6 in following the discussion of this specific embodiment below.

The summer/multiplier 1 comprises summer 30 that receives the input audio signal from input terminal 24 and the feedback signal provided by amplifier 35. Summer 30 is implemented in FIG. 6 as an operational amplifier connected in the normal inverting summer amplifier configuration. A capacitor connected between the junction of a pair of like input resistors and system ground shunts the high frequency signal components to system ground. Half of analog switch U304 delivers the remaining low frequency components to virtual ground at the input of integrated circuit U102. A modulating signal on the MOD line from compressor block 5 toggles the switches at a 50 kHz rate. Controlling the length of time the switch is closed on each cycle effects multiplication. For signals characterized by spectral components in a bandwidth much less than 50 kHz the switch may be regarded as an impedance of magnitude proportional to the duty cycle of the modulating signal waveform. In normal operation the switch is closed most of the time. Upon detection by compressor 5 of an exceptionally large input amplitude, the on duty cycle is reduced, thereby attenuating low frequency spectral components of the input signal.

A series connected resistor and capacitor delivers the high frequency signal components directly to the input U102 so as to be unaffected by multiplier action.

The output of summer/multiplier block 1 is delivered to compensation block 2 comprising an active filter characterized by magnitude and phase characteristics that insure stability of the feedback loop without appreciably compromising the overall loop gain. Section 2c provides gain with proper rolloff at high frequencies. Sections 2a and 2b compensate the phase response of the loop gain at the low and high frequency crossover points, respectively. The principles of this preferred form of compensation are discussed below and facilitate high gain in a band of frequencies including most voice spectral components while maintaining stability that avoids oscillation.

Power amplifier block 3 receives the output signal from compensation block 2. Section 3b is a conventional noninverting amplifier with discrete output current buffer. Section 3a comprises a simple diode limiter for protecting the driver from being driven to a destructive level of power dissipation. Light emitting diodes illuminate when limiting occurs. Preferably, the input is A.C.-coupled to eliminate D.C. offsets from previous stages.

Figure 6:
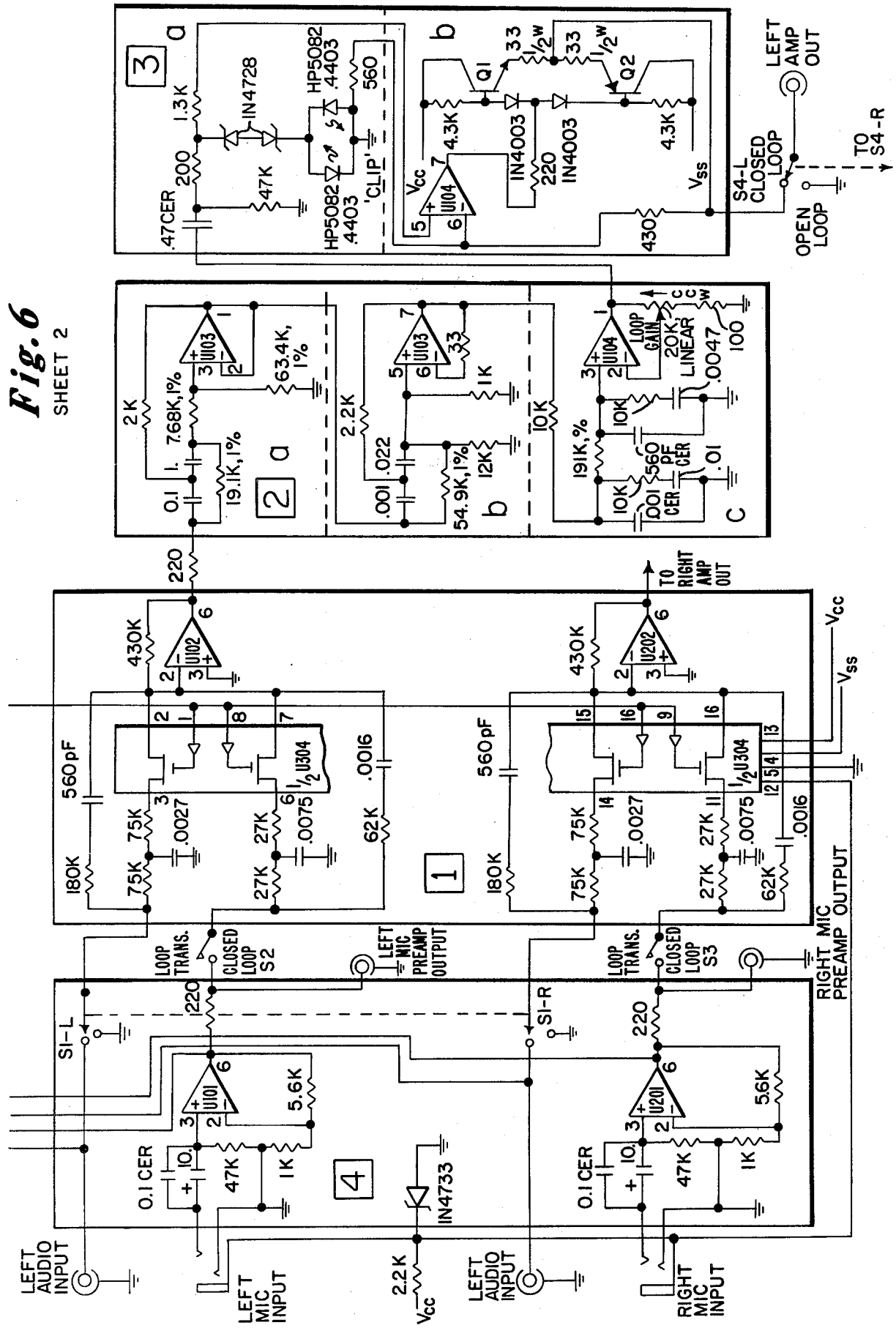
FIG. 6 is a schematic circuit diagram of electronic circuitry implementing the block diagram of FIG. 5.

The driver/microphone/ear system block 6 is not shown in FIG. 6. Driver 17 receives the amplified signal from power amplifier block 3 to produce an acoustical signal perceived by ear 16 and transduced by microphone 11. Imperfect seal of cushion 15 causes a low frequency rolloff. A complex structure of resonances at frequencies above a few kilohertz also characterizes block 6. Furthermore, there is excess phase shift caused by propogation delay from driver 17 to microphone 11 and the distributed source nature of driver 17. Yet, the elements in the system coact to compensate for these nonuniform characteristics and produce an overall system closed-loop frequency response between input terminal 24 and ear canal 18 that is substantially uniform.

The microphone preamplifier block 4 receives the transduced signal from microphone 11 and comprises a low noise operational amplifier connected for noninverting gain. The amplifier and gain were selected to allow the self-noise of the microphone to dominate, thereby minimizing the contribution by the system electronics to the noise level at the ear 16. A Zener diode provides the biasing voltage $V_{cc}$ for electret microphone 11. Amplifier 35 in summer/multiplier block 1 receives the preamplified signal provided by microphone preamplifier 4.

Compressor block 5 monitors both the signal at input terminal 24 and the feedback signal at the output of microphone preamplifier 4 to provide the modulating signal on the MOD line for modulating the low frequency gain of summer/multiplier block 1. Section 5a sums feedback and input signals in both left and right channels. A low pass filter having a break frequency typically at 400 Hz selectively transmits the combined signal for full wave rectification. Section 5b averages the rectified signal with a fast attack and slow decay time to provide an output signal proportional to the low frequency spectral energy in both left and right loops. Section 5c converts the latter signal to a proportional current with offset, the gain and offset being controlled by potentiometers.

Section 5d receives the output current signal from section 5c for providing the 50 kHz modulating signal on the MOD line. Integrated circuit U305 in FIG. 6 comprises a 50 kHz clock pulse source that triggers integrated circuit U306 to reset its output to ground every 20 microseconds. The capacitor voltage at pin 2 of integrated circuit U306 then decreases linearly at a rate proportional to the output current provided by section 5c until it reaches a threshold level to switch the output switches of integrated circuit U306 high and reset the capacitor voltage at terminal 2 to the positive supply until triggered again. Since the analog switches in summer/multiplier block 1 are closed for a ground potential on control pins 1 and 8, the summer/multiplier gain for low frequencies is inversely proportional to the level of the current provided by section 5c. Large currents cause the capacitor potential on pin 2 of integrated circuit U306 to reach the threshold level faster, and the analog switches U304 are correspondingly closed for a shorter period of time. Section 5e drives an LED bar graph display which indicates the amount of compression. It is sufficient to sense and act solely on low frequencies because low frequency spectral components carry most of the energy of typical input signals.

In summary the complete system may be considered as a servosystem with two input signals. The first is the audio electrical signal to be reproduced. The second is the ambient acoustic noise signal at the ear. The system output is the acoustical signal produced at the ear. The feedback signal is a voltage proportional to the instantaneous sound pressure at the entrance to the ear canal. This sound pressure is a combination of the sound provided by the driver and the ambient acoustic noise. The small electret microphone 11 transduces this signal, preamplifier block 1 amplifies it, and summer/multiplier block 1 sums this feedback with the input audio signal to provide an error signal representative of the difference between the actual sound pressure at the ear and the desired pressure, the latter being proportional to the input audio signal. Compensation block 2 selectively transmits the spectral components of the error signal to insure loop stability. Amplifier block 3 amplifies the compensated signal and delivers the amplified compensated signal to the driver 17 to produce a resultant sound pressure at the ear corresponding to the desired audio input signal. Thus, over the range of frequencies for which the feedback loop is active, the loop corrects for the spectral coloration of the driver/microphone/ear system and cancels ambient noise. The amount of correction is related to the magnitude of stable gain which the loop can provide. Compressor block 5 coacts with the multiplier portion of summer/multiplier block 1 to prevent an input audio or acoustic signal from overdriving the loop into clipping.

Having described a preferred embodiment of the system, certain subsystems and their features will be described. Compressor block 5 is embodied in particularly advantageous form that reduces compression artifact and avoids nonlinear oscillation. Prior art compressors typically may be classified into basic types, n-to-1 and thresholding. An n-to-1 compressor produces one dB change in output level for each ndB in input level. A thresholding compressor typically is linear for input signal levels below some threshold and assumes some n-to-1 compression ratio above this threshold, the ratio sometimes being infinite above threshold level so as to limit the average output level.

N-to-1 compressors are commonly used in compandors for compressing signals for transmission through noisy communications channels or recording on noisy media and then expanding the compressed signal after detection to restore the signal to its original dynamic range with recording or communications channel noise significantly attenuated after expansion. A thresholding compressor is generally used in systems where the signal will not later be expanded or uncompressed because, when properly designed, they leave less of an undesirable artifact in the output signal than n-to-1 compressors. A threshold compressor with an infinite compression ratio above threshold is typically implemented with a feedback loop. If the compressor gain and the compressor attack and decay time constants are not carefully chosen, significant undesirable audible artifacts result, particularly for input levels just above threshold, and the system may oscillate, thereby producing unpleasant audible sounds.

Figure 7:
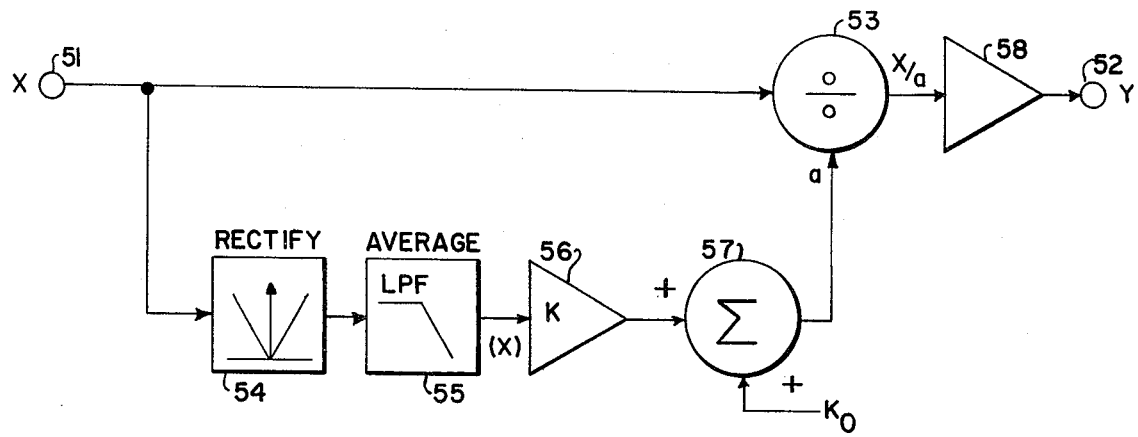
FIG. 7 is a block diagram illustrating the logical arrangement of a preferred form of compressor.

The present invention incorporates an advance over the typical prior art thresholding compressor with infinite compression ratio above threshold. FIG. 7 is a block diagram illustrating the logical arrangement of the system generally embodied in block 5. The system responds to an input signal X on terminal 51 by providing a compressed signal Y on terminal 52. The dividend input of divider 53 is connected to input terminal 51. Input terminal 51 is also connected to the input of a full wave rectifier 54. The output of full wave rectifier 54 is connected to the input of an averaging low pass filter 55 characterized by a decay response time constant that is much greater than the attack response time constant. The output (X) of averaging low pass filter 55 is connected to the input of amplifier 56 introducing a compressor gain K. Summer 57 receives a signal $K_o$ on its other input to provide a divisor signal at the divisor input of divider 53. Divider 53 provides a quotient signal x/a at the input of output amplifier 58 that provides the compressed output signal Y.

Figure 8:
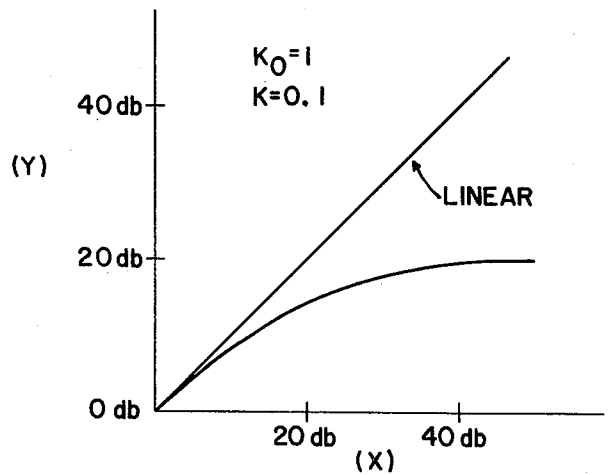
FIG. 8 illustrates the compression characteristic of the compressor of FIG. 7.

It can be shown that for static signals, such as sine waves, the input to output gain is $Y/X = 1/(K_o + K(X))$. FIG. 8 shows this compression characteristic graphically. This characteristic is similar to the characteristic of a thresholding compressor with infinite compression ratio above threshold in that for small signals $Y/X = 1/K_o$ = constant, and for large signal $Y/X = 1/KX$ or $Y = 1/K$. However, the compressor according to the invention has at least two advantages over the prior art thresholding compressor. It causes less audible compression artifact for complex input signals, such as music, because the transition from no compression to full compression is smoother. Furthermore, since there is no feedback, it cannot go into nonlinear oscillation.

Turning now to preferred forms of compensation. It is known that if the attenuation of gain $A(\omega)$ is known over the entire range of frequencies, then the phase $\Phi(\omega)$ for a minimum phase network is uniquely determined; and similarly, if $\Phi(\omega)$ is known over the entire range of frequencies, then $A(\omega)$ is uniquely determined for a "minimum-phase" function having no poles or zeros in the right half of the s or p plane. This property is described in section 4.9 under the heading ATTENUATION-PHASE RELATIONSHIPS FOR SERVO TRANSFER FUNCTIONS in Volume 25 of the M.I.T. RADIATION LABORATORY SERIES entitled "Theory of Servomechanisms." This relationship was first reported in a paper by Y. W. Lee in the Journal of Mathematics and Physics for June 1932 and is discussed in Chapter XIV entitled "Relations between Real and Imaginary Components of Network Functions," in NETWORK ANALYSIS AND FEEDBACK AMPLIFIER DESIGN by Bode (D. VanNostrand Co., New York 1945). In section 4.8 of the aforesaid "Theory of Servomechanisms" the "attenuation-phase" type of analysis is described as the most satisfactory approach to the servo design problem and describes the criterion of phase margin at the frequency of feedback cutoff as a good practical criterion of system stability that should be at least 30° and preferably 45° or more. For 6 db per octave attenuation beyond cutoff, this section explains that the frequency where the gain A is one (log A = 0) should be at least 2½ octaves from the cutoff frequency to develop sufficient phase margin. The purpose of establishing phase margin is to avoid a situation that would support undesired oscillations, and also to eliminate peaking which amplifies external noise. A disadvantage of establishing such an extensive region between the frequency $f_c$ where the gain is 1 and the break frequency is that the desirable effects of negative feedback for spectral components within the frequency region is significantly reduced. The present invention overcomes this disadvantage by combining networks in a manner that provides high open loop gain in the frequency band of interest while still maintaining stability to establish both attenuation or gain characteristics and phase characteristics in such a manner that there is adequate phase margin at the frequency $f_c$ of unity gain.

The present invention includes compensating means characterized by open loop gain or attenuation frequency response characteristics with regions of arbitrary slope at the pass band end or ends while establishing a stable phase margin at the frequency $f_c$ where the gain falls to zero. These principles will be better understood from the following example.

Referring to FIGS. 9A and 9B, there are shown graphical representations of the gain or attenuation and phase characteristics for an operational amplifier having a normally first order characteristic. The gain is typically represented as uniform to the half-power or break frequency $\omega_o$ and thereafter decreases linearly 6 db per octave. Referring to FIGS. 10A and 10B there is shown a graphical representation of a modification of the attenuation and phase characteristics shown in FIGS. 9A and 9B, respectively, applying the principles of the invention to achieve more loop gain above $f_o$ while maintaining the phase margin substantially the same. This is accomplished by adding the portion indicated by broken lines with breakpoint at $f_1$ beyond $f_o$ and slope 12 db per octave to frequency $f_2$ where the slope then resumes the more gradual slope of 6 db per octave. The modified phase characteristic represented by the broken line in FIG. 10B still has a phase margin of substantially $\pi/2$.

Referring to FIG. 11, there is shown a modified bandpass response in which the broken lines represent the modification of the gain or attenuation over a more conventional approach having 6 db per octave slope on either side of the transmission band. These compensation circuits have a slope nearer the break frequency that is of greater magnitude than the slope in the frequency range nearer the critical frequency $f_c$ where the gain is unity while having adequate phase margin.

The compensation circuitry in block 2 of FIGS. 5 and 6 embodies these principles. It can be seen that the loop compensation follows these guidelines from the open loop gain curves. In FIG. 4, the slope just after the break frequency (at 500 Hz) is 18 db/octave. The network in section 2a has a zero at 80 Hz and pole at 92 Hz, with damping constants 0.56 and 1.1, respectively. The high frequency circuit in section 2b has a zero at 3.1 kHz and pole = 7.3 kHz with damping constants 0.49 and 1, respectively. The circuit and low pass filter in section 2c have zeroes at 1.6 kHz and 3.4 kHz and poles at 160 Hz, 320 Hz, 800 Hz and 34 kHz.

It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Headphone apparatus comprising,
   driver means for converting an input electrical signal into an acoustical output signal and having a vibratable diaphragm,
   housing means for supporting said driver means and having a cushion supporting bracket,
   cushion means for engagement with said cushion supporting bracket and formed with a central opening defining a cavity accommodating said diaphragm for establishing a seal between said cushion supporting bracket and an outer ear to inhibit air flow between said cavity and the region outside said apparatus to significantly attenuate spectral components through the middle frequency range,
   and electroacoustical means separate from said driver means for transducing an acoustical pressure signal in said cavity to a corresponding transduced electrical signal,
   said electroacoustical transducing means being closely adjacent to said diaphragm and sufficiently close to the edge of said cavity away from said cushion support means so that said transducing means is responsive to the pressure in said cavity near the ear.

2. Headphone apparatus in accordance with claim 1 wherein the distance between said electroacoustical transducing means and said diaphragm is less than the diameter of said diaphragm.

3. Headphone apparatus in accordance with claim 2 wherein the distance between said electroacoustical transducing means and said cavity edge away from said cushion support bracket is less than the maximum span across said diaphragm.

4. Headphone apparatus in accordance with claim 1 wherein the axial cross-sectional area of said cavity is less than the axial cross-sectional area of said cushion means surrounding and defining said cavity.

5. Headphone apparatus comprising,
   driver means for converting an input electrical signal into an acoustical output signal and having a vibratable diaphragm,
   housing means for supporting said driver means and having a cushion supporting bracket,
   cushion means for engagement with said cushion supporting bracket and formed with a central opening defining a cavity accommodating said diaphragm for establishing a seal between said cushion supporting bracket and an outer ear to inhibit air flow between said cavity and the region outside said apparatus to significantly attenuate spectral components through the middle frequency range,
   electroacoustical means for transducing an acoustical signal in said cavity to a corresponding transduced electrical signal,
   said electroacoustical transducing means being closely adjacent to said diaphragm and sufficiently close to the edge of said cavity away from said cushion support means so that said transducing means is responsive to the pressure in said cavity near the ear,
   power amplifying means for providing an amplified signal to said driver means,
   and means for inversely feeding back said transduced signal to said power amplifier means to produce in said cavity a signal component from said driver means tending to cancel the acoustical signal entering said cavity from outside said apparatus.

6. Headphone apparatus in accordance with claim 5 wherein said means for inversely feeding back comprises,
   combining means for algebraically combining the inversely fed-back transduced signal with said input signal characteristic of a desired acoustical signal to be reproduced in said cavity and further comprising,
   an input terminal for receiving said input electrical signal coupled to said combining means,
   and means for coupling the combined signal provided by said combining means to said power amplifying means to provide an acoustical signal in said cavity also having a component representative of said input signal.

7. Headphone apparatus in accordance with claim 6 wherein said means for coupling said combined signal to said power amplifying means comprises compensating circuit means for establishing an open loop gain having a maximum gain over a predetermined range of low and middle audio frequencies.

8. Headphone apparatus in accordance with claim 7 wherein said range is from substantially 40 to 2000 Hz.

9. Headphone apparatus in accordance with claim 5 wherein said means for inversely feeding back is in a loop characterized by loop gain and said loop comprises compressor means responsive to said input electrical signal and said transduced electrical signal for reducing said loop gain to prevent overload and audible distortion without audible artifacts and oscillation.

* * * * *